(12) United States Patent
Tanner

(10) Patent No.: US 7,566,836 B2
(45) Date of Patent: Jul. 28, 2009

(54) POTTING SHELL

(75) Inventor: Juergen Tanner, Kandern (DE)

(73) Assignee: Endress + Hauser GmbH +Co. KG, Maulburg (DE)

( * ) Notice: Subject to any disclaimer, the term of this patent is extended or adjusted under 35 U.S.C. 154(b) by 326 days.

(21) Appl. No.: 10/569,726

(22) PCT Filed: Jul. 30, 2004

(86) PCT No.: PCT/EP2004/008573

§ 371 (c)(1),
(2), (4) Date: Mar. 12, 2007

(87) PCT Pub. No.: WO2005/029935

PCT Pub. Date: Mar. 31, 2005

(65) Prior Publication Data

US 2007/0165363 A1   Jul. 19, 2007

(30) Foreign Application Priority Data

Aug. 29, 2003  (DE) ................. 103 40 328

(51) Int. Cl.
*H01L 23/28* (2006.01)
(52) U.S. Cl. ............... 174/525; 174/560; 174/521; 361/752; 257/787
(58) Field of Classification Search ............... 174/525, 174/559, 560, 521; 257/787; 361/752, 764
See application file for complete search history.

(56) References Cited

U.S. PATENT DOCUMENTS

| 4,076,791 | A | | 2/1978 | Barter | |
|---|---|---|---|---|---|
| 5,336,931 | A | * | 8/1994 | Juskey et al. | 257/787 |
| 6,288,335 | B1 | * | 9/2001 | Lee | 174/521 |
| 6,534,711 | B1 | * | 3/2003 | Pollack | 174/529 |
| 6,583,355 | B2 | * | 6/2003 | Skrzypchak | 174/521 |
| 7,146,721 | B2 | * | 12/2006 | Hunkeler et al. | 29/841 |
| 2002/0056562 | A1 | | 5/2002 | Skrzypchak | |
| 2002/0166687 | A1 | * | 11/2002 | Tornovist et al. | 174/52.2 |

FOREIGN PATENT DOCUMENTS

| DE | 35 05 086 A1 | 8/1986 |
|---|---|---|
| DE | 39 15 707 A1 | 11/1990 |
| DE | 42 24 122 A1 | 1/1994 |
| EP | 0 482 419 A1 | 4/1992 |
| EP | 0 641 154 A1 | 3/1995 |
| EP | 1 215 027 A1 | 6/2002 |
| JP | 61193471 A | 8/1986 |

* cited by examiner

Primary Examiner—Hung V Ngo
(74) Attorney, Agent, or Firm—Bacon & Thomas, PLLC

(57) ABSTRACT

A potting shell, for an electronic circuit on a circuit board, comprises a wall arrangement, which defines a shell volume at least in one spatial direction and in the directions perpendicular thereto; wherein the circuit board is positionable in the shell volume, and can be potted in the shell volume with a potting compound. The volume between the circuit board and a main wall of the potting shell, running essentially parallel, at least sectionally, to the circuit board, can be filled with a potting compound, characterized in that the main wall has at least one flexible section, which, based on a thermal expansion of the potting compound, can be deformed perpendicular to the plane of the flexible section.

22 Claims, 1 Drawing Sheet

POTTING SHELL

FILED OF THE INVENTION

The present invention concerns a potting shell for a populated circuit board.

BACKGROUND OF THE INVENTION

In many applications, electronic circuits on circuit boards are potted with a potting compound in order to protect the electronic circuit from the effects of moisture, for example, and to maintain critical separation distances between components. For this, the populated circuit boards are inserted directly into either a housing or a potting shell, whereupon the housing or the potting shell is filled with the potting compound until the desired degree of moisture protection is ensured.

To the extent that the potting compound has a different coefficient of thermal expansion than the surrounding housing or components of the electronic circuit, or circuit board, fluctuations in temperature can lead to deformation of the circuit board such that the electronic circuit, which is arranged on the circuit board, is damaged. This applies both for circuits which are arranged in a housing, and for those initially positioned in a conventional potting shell.

SUMMARY OF THE INVENTION

Therefore, it is an object of the invention to provide a potting shell which overcomes the described disadvantages.

This object is achieved according to the invention by the potting shell for an electronic circuit on a circuit board includes a wall arrangement, which bounds a shell volume in at least one spatial direction and in the directions perpendicular thereto, wherein the circuit board is positionable in the shell volume, and can be potted in the shell volume using a potting compound, wherein the volume between the circuit board and a main wall of the potting shell running essentially parallel, at least sectionally, to the circuit board can be filled with potting compound, characterized in that the main wall has at least one flexible section, which can be deformed due to a thermal expansion of the potting compound perpendicular to the plane of the flexible section.

This object is also achieved by an electronic module with the defined potting shell, and by a measuring transmitter with the defined potting shell.

The one spatial direction in which the wall arrangement defines the shell volume can be downward, for example, with this being provided, in this case, by the floor of the shell. The directions perpendicular thereto are defined laterally by side walls. Of course, other orientations of the potting shell are possible, especially after the potting compound has hardened, or cured.

The main wall can include both the floor of the potting shell and a side wall of the potting shell. Accordingly, the potting shell can have an opening through which the circuit board can be inserted with its base surface into the shell, or the potting shell can have a slot-like opening through which the circuit board can be inserted with its narrow side into the potting shell.

The potting shell can be produced, for example, as an injection-molded component comprised of a thermoplastic or thermoelastic material. The wall thickness of the injection-molded component, outside of the flexible section, can be 1 mm to 2 mm, for example. The wall thickness in the flexible section is to be made appropriately thinner, with, if necessary, requirements for fixed insulation distances being maintained here. If, for example, 0.6 mm fixed insulation distances are required, and the tolerance of the material thickness is 0.2 mm, then the desired thickness of the flexible section should preferably not subceed, i.e. fall beneath, 0.8 mm. In a presently preferred embodiment, the wall thickness outside of the flexible section is 1 mm, and 0.8 mm within the flexible section.

According to a presently preferred embodiment of the invention, the flexible section has a lesser wall thickness than other wall sections of the potting shell. The surface of the flexible section can, especially, be surrounded by a frame, which has a greater wall thickness than the flexible section.

In accordance with a presently preferred embodiment of the invention, the outside of the main wall defines a support surface, with which the potting shell can lie on a substrate, for example on a housing wall of an electronics housing, or with which the potting shell is braced laterally against a substrate. Preferably, the support surface is at least sectionally convex or planar. The flexible section is recessed with respect to the support surface; that is, the exterior side of the flexible support surface is shifted in the direction of the interior of the potting shell. In this way, it is ensured that the flexible section, unlike the support surface, does not lie on the substrate. Thus the flexible section can bow outward in order to absorb the thermal expansion of the potting compound perpendicular to the plane of the flexible section.

Preferably, the flexible section is formed such that, at its center, at least 50% of the thermal expansion of the potting compound can be absorbed perpendicular to the plane of the flexible section. The thermal expansion here is with reference to the temperature range for which the circuits are specified, for example from −40 degrees Celsius to +85 degrees Celsius.

In a preferred embodiment of the invention, the wall thickness of the flexible section amounts to no more than 80% of the wall thickness outside of the flexible section.

In a further development of the invention, the wall arrangement of the potting shell includes openings for electrical feed-throughs, with these openings being surrounded by elastic seals at least on one side of the wall arrangement. In a presently preferred embodiment, the openings in the main wall are provided with seals on their exterior side. The seals on the exterior side of the main wall lie on the substrate, in which case they seal electrical connections or feed-throughs for electrical connections in the substrate. Seals on the interior side of the main wall bear on the circuit board in order to, on the one hand, prevent the penetration of potting compound into the openings, and, on the other, to avoid the penetration of moisture through the openings into the potting shell.

To the extent necessitated by the contour of the shell, the seals can be arranged on protrusions which extend from the main wall into the interior of the shell volume.

The electronics module of the invention includes an electronic circuit on a circuit board, which is arranged in the potting shell of the invention, and is potted therein.

The invention is especially suited for use in measuring transmitters, particularly those in the field of industrial process measurement technology, since the electronic circuits in this area of application are exposed to very harsh environmental conditions, such as fluctuations in temperature and high humidity. Typical process parameters registered with such measuring transmitters are pressure, pressure difference, fill level, flow rate, temperature, pH-value, redox potential, humidity, turbidity, or the content of a gas dissolved in a liquid. This list of process parameters is only for the purpose of illustration, and should not be taken as limiting for the scope of protection of the present invention.

BRIEF DESCRIPTION OF THE DRAWINGS

Further details will be evident from the description of the example of an embodiment shown in the drawings, the figures of which show as follows.

DESCRIPTION OF THE PREFERRED EMBODIMENTS

Figure 1:
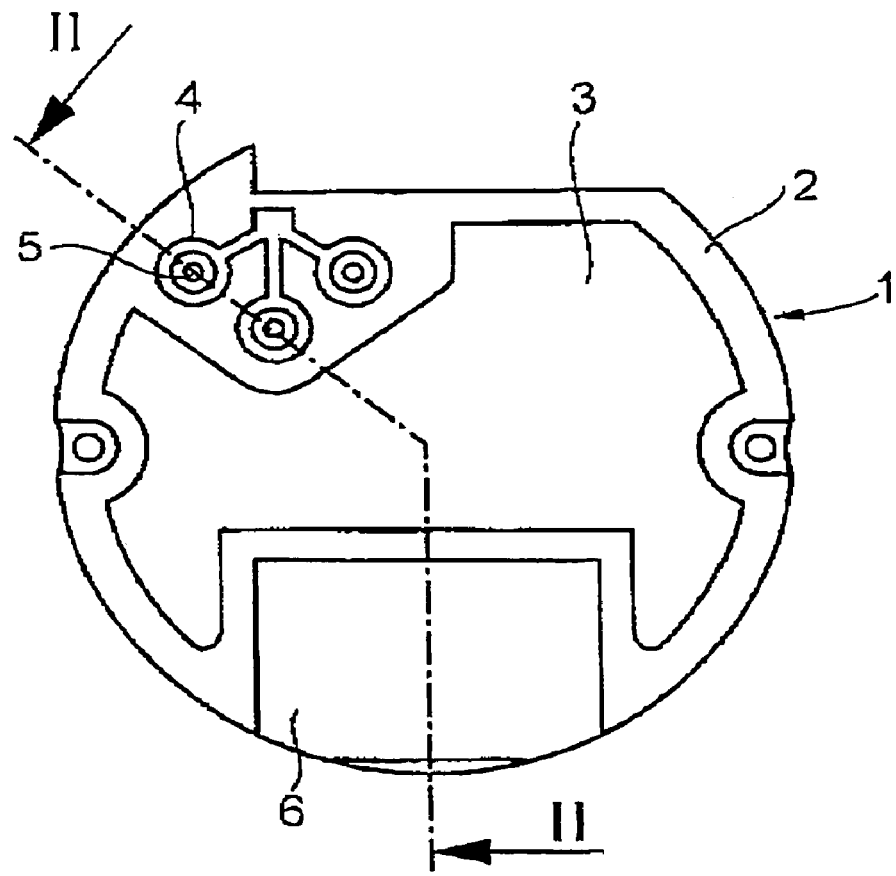
FIG. 1 a plan view of a potting shell in accordance with the invention.
Figure 2:
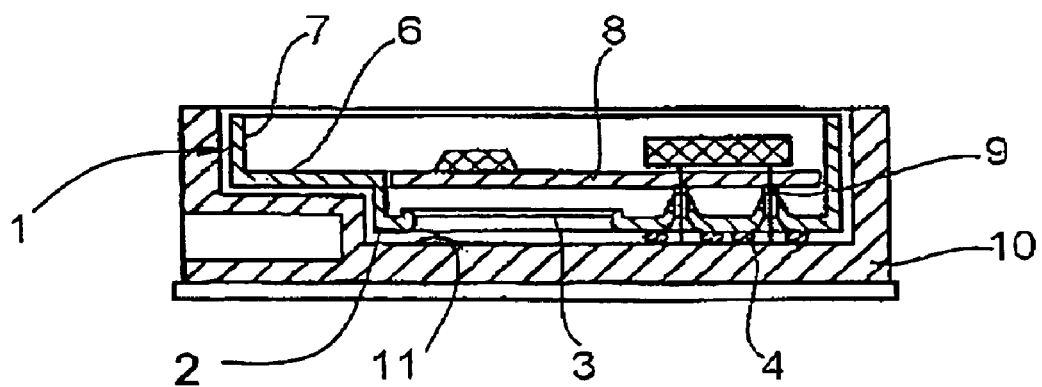
FIG. 2 a sectional view taken along the line II-II of FIG. 2, showing the potting shell with a circuit board populated and inserted into a housing.

The potting shell 1 shown in FIGS. 1 & 2 includes a wall arrangement, with a planar base frame 2, which defines a support surface, with which the potting shell rests on the floor 11 of an electronics compartment in a housing 10. The potting shell 1 is defined laterally by a surrounding edge 7, which extends essentially perpendicularly to the plane of the frame 2. In the frame 2, a flexible section 3 is arranged, which runs essentially parallel to the plane of the support surface, and is recessed with respect thereto.

The wall thickness of the flexible section 3 accounts for approximately 80% of the wall thickness of base frame 2, such that the flexible element, in cases of thermal expansion of a potting compound, can deform more easily. Additionally, through the recessing of the flexible element 3, sufficient space between the floor of the electronics chamber and the flexible element 3 is available, such that in the case of a deformation, the flexible section does not contact the floor 11.

Where required, the wall arrangement of the potting shell can have steps, as is illustrated in the example of the embodiment on the basis of the socket 6. Thus, in addition to the frame and the flexible section 3, the main wall includes a second section 6, which, if necessary, can of course also be configured as flexible section. In the base of the potting shell 1, three openings 5 are arranged, which are provided for passing electrical contacts 9 through to the circuit board 8. The openings 5 are surrounded by elastic seals 4, which, in the example of the embodiment, are linked with one another in order to simplify fabrication.

On the interior side of the frame 2, protrusions are arranged at the openings 5, which extend into the interior of the shell. On the end surfaces of the protrusions, elastic seals are provided, which surround the openings. The circuit board 8 lies on these openings.

The potting shell 1 is filled with potting compound at least to the underside of the circuit board.

By means of the seals on the end surfaces of the protrusions, it is assured that the potting compound cannot penetrate into the openings 5 and thus close them. This is important in cases where a contacting is to be done after the potting. Additionally, as indicated above, the seals serve as moisture barriers.

The invention claimed is:

1. A potting shell for a populated circuit board, including:
a wall arrangement with a main wall, said wall arrangement defines a shell volume at least in one spatial direction, and in the directions perpendicular thereto, wherein:
the circuit board is positionable in the shell volume, and can be potted in the shell volume with a potting compound;
the volume between the circuit board and a main wall of the potting shell, running essentially parallel, at least sectionally, to the circuit board, can be filled with a potting compound; and
said main wall has at least one flexible section, which, based on a thermal expansion of the potting compound, can be deformed perpendicular to the plane of said flexible section.

2. The potting shell as claimed in claim 1, wherein:
said flexible section has a lesser wall thickness than other wall sections of the potting shell.

3. The potting shell as claimed in claim 2, wherein:
the wall thickness in said flexible section amounts to not more than 80% of the wall thickness outside of said flexible section.

4. The potting shell as claimed in claim 2, wherein:
the wall thickness in said flexible section amounts to not more than 80% of the wall thickness outside of said flexible section.

5. The potting shell as claimed in claim 2, wherein:
the wall thickness in said flexible section amounts to not more than 80% of the wall thickness outside of said flexible section.

6. The potting shell as claimed in claim 1, wherein:
the exterior side of said main wall defines at least one support surface; and
said at least one flexible section is recessed with respect to said support surface.

7. The potting shell as claimed in claim 1, wherein:
said flexible section, in its center, can absorb at least 50% of the thermal expansion of the potting compound perpendicular to the plane of said flexible section.

8. The potting shell as claimed in claim 1, wherein:
said main wall, outside of said flexible section, has at least one opening for electrical feed-throughs; and
said at least one opening is surrounded on the exterior side of the potting shell, and/or on its interior side, by an elastic seal.

9. The potting shell as claimed in claim 8, wherein:
said at least one opening is surrounded on the interior side by a protrusion, which extends from said main wall into the interior of the potting shell; and
said elastic seal is arranged on the protrusion.

10. The potting shell as claimed in claim 8, wherein:
said at least one opening is surrounded on the interior side by a protrusion, which extends from said main wall into the interior of the potting shell; and
said elastic seal is arranged on the protrusion; and
wherein the circuit board presses against said seal on the interior side of the potting shell.

11. The potting shell as claimed in claim 8, wherein:
said at least one opening is surrounded on the interior side by a protrusion, which extends from said main wall into the interior of the potting shell; and
said elastic seal is arranged on the protrusion; and
wherein the circuit board presses against said seal on the interior side of the potting shell.

12. The potting shell as claimed in claim 1, wherein:
the exterior side of said main wall defines at least one support surface; and
said at least one flexible section is recessed with respect to said support surface.

13. The potting shell as claimed in claim 1, wherein:
said flexible section, in its center, can absorb at least 50% of the thermal expansion of the potting compound perpendicular to the plane of said flexible section.

14. The potting shell as claimed in claim 1, wherein:
said main wall, outside of said flexible section, has at least one opening for electrical feed-throughs; and
said at least one opening is surrounded on the exterior side of the potting shell, and/or on its interior side, by an elastic seal;
and wherein the circuit board presses against said seal on the interior side of the potting shell.

15. The potting shell as claimed in claim 1, wherein:
the exterior side of said main wall defines at least one support surface; and
said at least one flexible section is recessed with respect to said support surface.

16. The potting shell as claimed in claim 1, wherein:
said flexible section, in its center, can absorb at least 50% of the thermal expansion of the potting compound perpendicular to the plane of said flexible section.

17. The potting shell as claimed in claim 1, wherein:
said main wall, outside of said flexible section, has at least one opening for electrical feed-throughs; and
said at least one opening is surrounded on the exterior side of the potting shell, and/or on its interior side, by an elastic seal;
and wherein the circuit board presses against said seal on the interior side of the potting shell.

18. An electronics module, comprising:
a populated circuit board, which is arranged in a potting shell, and is potted therein with potting compound;
said potting shell including:
a wall arrangement with a main wall, said wall arrangement defines a shell volume at least in one spatial direction, and in the directions perpendicular thereto, wherein:
the circuit board is positionable in the shell volume, and can be potted in the shell volume with a potting compound;
the volume between the circuit board and a main wall of the potting shell, running essentially parallel, at least sectionally, to the circuit board, can be filled with a potting compound; and
said main wall has at least one flexible section, which, based on a thermal expansion of the potting compound, can be deformed perpendicular to the plane of said flexible section.

19. The electronics module, as claimed in claim 18, wherein:
said flexible section has a lesser wall thickness than other wall sections of the potting shell.

20. The electronics module, as claimed in claim 18, wherein:
said flexible section has a lesser wall thickness than other wall sections of the potting shell.

21. A measuring transmitter for registering a process parameter, comprising:
a housing, in which an electronics module, is arranged which includes:
a wall arrangement with a main wall, said wall arrangement defines a shell volume at least in one spatial direction, and in the directions perpendicular thereto, wherein:
the circuit board is positionable in the shell volume, and can be potted in the shell volume with a potting compound;
the volume between the circuit board and a main wall of the potting shell, running essentially parallel, at least sectionally, to the circuit board, can be filled with a potting compound; and
said main wall has at least one flexible section, which, based on a thermal expansion of the potting compound, can be deformed perpendicular to the plane of said flexible section.

22. The measuring transmitter as claimed in claim 21, wherein the process parameter comprises pressure, pressure difference, fill level, flow rate, temperature, pH-value, redox potential, humidity, turbidity, or gas content in a liquid.

* * * * *